(12) United States Patent
Johnson et al.

(10) Patent No.: US 10,002,978 B2
(45) Date of Patent: Jun. 19, 2018

(54) PHOTOVOLTAIC MODULE INCLUDING A TRANSPARENT CONDUCTIVE ELECTRODE HAVING A VARIABLE THICKNESS, AND METHODS FOR MANUFACTURING SAME

(75) Inventors: Erik V. Johnson, Paris (FR); Pere Roca I Cabarrocas, Villebon sur Yvette (FR)

(73) Assignees: ECOLE POLYTECHNIQUE, Palaiseau (FR); CENTRE NATIONAL DE LA RECHERCHE SCIENTIFIC, Paris (FR); TOTAL S.A., Courbevoie (FR)

( * ) Notice: Subject to any disclaimer, the term of this patent is extended or adjusted under 35 U.S.C. 154(b) by 576 days.

(21) Appl. No.: 13/132,776

(22) PCT Filed: Dec. 3, 2009

(86) PCT No.: PCT/FR2009/052400
§ 371 (c)(1),
(2), (4) Date: Jun. 3, 2011

(87) PCT Pub. No.: WO2010/063970
PCT Pub. Date: Jun. 10, 2010

(65) Prior Publication Data
US 2011/0240090 A1   Oct. 6, 2011

(30) Foreign Application Priority Data
Dec. 3, 2008   (FR) ..................................... 08 58237

(51) Int. Cl.
*H01L 31/042* (2014.01)
*H01L 31/0224* (2006.01)
(Continued)

(52) U.S. Cl.
CPC .... *H01L 31/022466* (2013.01); *H01L 31/046* (2014.12); *H01L 31/1884* (2013.01); *Y02E 10/50* (2013.01)

(58) Field of Classification Search
USPC ......................................................... 136/244
See application file for complete search history.

(56) References Cited

U.S. PATENT DOCUMENTS 4,647,711 A   3/1987   Basol et al.
4,652,693 A   3/1987   Bar-On
(Continued)

FOREIGN PATENT DOCUMENTS

CA   1 227 861 A1   10/1987
CA   1 244 120 A    11/1988
(Continued)

OTHER PUBLICATIONS

International Search Report, dated Oct. 22, 2010, from corresponding PCT application.

*Primary Examiner* — Uyen M Tran
(74) *Attorney, Agent, or Firm* — Young & Thompson

(57) ABSTRACT

A photovoltaic module includes at least two photovoltaic cells in series, each rectangular cell including, respectively, a first rear thin film electrode, a photovoltaic stack having at least two active materials included between the rear electrode and a transparent conductive electrode made of a thin film, the electrode TC being capable of collecting and transmitting an electric current generated by the photovoltaic stack, the two photovoltaic cells being electrically connected in series by an electrical contact strip that is included between the electrode TC of the first cell and the rear electrode of the second cell. The local thickness of the electrode TC of the cell varies as a function of the distance to the electrical contact strip. Also described are methods for (Continued)

depositing and etching the transparent conductive film so as to simultaneously manufacture a plurality of cells for a single module.

16 Claims, 10 Drawing Sheets

(51) Int. Cl.
  *H01L 31/18* (2006.01)
  *H01L 31/046* (2014.01)

(56) References Cited

U.S. PATENT DOCUMENTS

| | | | |
|---|---|---|---|
| 4,745,078 A | 5/1988 | Stetter et al. | |
| 5,512,107 A * | 4/1996 | van den Berg | 136/251 |
| 5,981,864 A | 11/1999 | Mizutani et al. | |
| 6,011,215 A | 1/2000 | Glatfelter et al. | |
| 6,168,968 B1 | 1/2001 | Umemoto et al. | |
| 6,452,087 B2 * | 9/2002 | Sasaki | H01L 31/022425 136/244 |
| 7,381,887 B2 * | 6/2008 | Tanaka | 136/256 |
| 2001/0037823 A1 | 11/2001 | Middelman et al. | |
| 2005/0016583 A1 | 1/2005 | Blieske et al. | |
| 2005/0272175 A1 * | 12/2005 | Meier et al. | 438/22 |
| 2009/0173382 A1 | 7/2009 | Yagiura | |
| 2010/0018564 A1 | 1/2010 | Shinohara | |
| 2010/0218827 A1 * | 9/2010 | Aono et al. | 136/264 |
| 2010/0314705 A1 * | 12/2010 | Repmann et al. | 257/443 |

FOREIGN PATENT DOCUMENTS

| | | |
|---|---|---|
| DE | 36 06 557 A1 | 9/1987 |
| EP | 0 422 511 A2 | 4/1991 |
| EP | 0 935 296 A | 8/1999 |
| FR | 2 832 706 A1 | 5/2003 |
| JP | 2002280580 A | 9/2002 |
| JP | 2004214442 A | 7/2004 |
| WO | 2005/119796 A1 | 12/2005 |
| WO | 2008/005027 A2 | 1/2008 |
| WO | 2008016042 A1 | 2/2008 |
| WO | 2008038553 A1 | 4/2008 |
| WO | 2008074879 A2 | 6/2008 |

* cited by examiner

PHOTOVOLTAIC MODULE INCLUDING A TRANSPARENT CONDUCTIVE ELECTRODE HAVING A VARIABLE THICKNESS, AND METHODS FOR MANUFACTURING SAME

The present invention relates to the technical field of photovoltaic cells, and more particularly to the field of transparent electrodes, which are a necessary element of these photovoltaic cells.

BACKGROUND OF THE INVENTION

There is an increasing interest for photovoltaic cells due to the improvement of their energy efficiency. Such photovoltaic cells are based on the use of a photovoltaic stack of active materials, which absorbs an optical energy, for example solar energy, and converts it into electric current coming from an electrochemical potential difference between the active layers. The photovoltaic stack can formed inside a bulk material (a sheet of crystalline or polycrystalline silicon) or thanks to materials deposited as thin layers onto a substrate. The potential difference may come from the doping of a material or the use of different materials. A photovoltaic cell also comprises electrodes on either sides of the photovoltaic stack, to collect the thus-generated electric current and to transport it laterally to the edges of the cell. A photovoltaic module is formed by connecting several photovoltaic cells in series and/or parallel.

The metal electrodes are generally opaque to the visible light. However, electrodes have been developed, which are both transparent and conductive and which can be placed on the surface exposed to the optical radiation of a photovoltaic stack. For the bulk material cells, the doped layer opposite the illumination source (hereinafter, this layer will be referred to as "the emitter") can be conductive enough—for example if it is made of a doped bulk material—to transport the charge carriers laterally over distances of the order of the millimeter. Then, a metal mesh grid is used to transport the current over the remaining route to the edges of the cell. Often, for the thin layers, the doped active layer is not conductive enough to efficiently carry out this transportation, and another electrode material that is both transparent and conductive is necessary. The materials used for these transparent electrodes are in particular metal oxides (TCO, for Transparent Conductive Oxides) that are typically metal oxides doped with another element, such as fluorine-doped tin oxide ($SnO_2$:F) or aluminium-doped zinc oxide (ZnO:Al).

For the photovoltaic cells obtained by stacking of thin layers, two types of structure exist. According to a first type of structure, of the "superstrate" type, a transparent substrate serves as a window for the photovoltaic cell. In this case, a transparent electrode is deposited as a thin layer of transparent conductive oxide (TCO) onto the transparent substrate (a glass sheet, for example). The photovoltaic stack and the back electrode are then deposited successively according to the known deposition methods. According to a second type of structure, of the "substrate" type, a metal electrode is deposited onto a substrate (not necessarily transparent), then the thin layers of photovoltaic materials are deposited above, and finally a transparent electrode is deposited above the photovoltaic stack. The thus-formed cell is then encapsulated.

In the photovoltaic cells based on a bulk photovoltaic material, this material serves as a substrate, a metal electrode is deposited onto the back face of the material, and the emitter on the front face (produced by thermal diffusion of a dopant or by ionic implantation) takes part in the lateral transportation of the carriers. A metal grid is deposited so as to complete the conductive circuit for the carriers up to the external electrodes. The HIT (Heterojunction with Intrinsic Thin Layer) cells constitute a particular case, because they use a bulk material but the doped layers are deposited from gas-phase precursors and are not conductive enough. Therefore, this type of cell requires a TCO layer for the lateral transportation of the carriers, as in the case of cells based on thin layers deposited onto a substrate. Moreover, the bulk silicon cells can also use a TCO layer as an antireflection layer.

To enter a photovoltaic cell, whatever the type of cell used, the light passes through a window that must fulfil two functions: it must be as much transparent as possible to allow a maximum flow of light to pass through, and it must be as much conductive as possible to minimize the ohmic losses when the photo-current is collected. However, the transparent electrodes have lower electric properties than the metal electrodes.

In order to increase the current collection by a transparent electrode, certain devices use a window that comprises a thin layer of a transparent conductive oxide (TCO), used either alone or in combination with a metal grid. The use of such a metal grid is, for example, described in the patent document CA1244120. In the cell areas that are close to the connection where the current will be possibly extracted, the surface area occupied by the fingers of the grid increases: the fingers are there closer to each other and/or wider. The surface area occupied by the fingers of the grid becomes more important, and thus a greater surface area of the cell is masked by the fingers, however the obtained increase of lateral conductivity is clearly advantageous for the cell efficiency.

For the thin-layer cells, it is common to use only a TCO layer without a metal grid. The commonly used TCO materials and the thicknesses thereof are, for example: $SnO_2$:F (800 nm), ZnO:Al (600 nm) and ITO (200 nm). ZnO:Al is preferably used in applications in which the photovoltaic thin layer is deposited above the TCO layer, in conditions rich in hydrogen, because this TCO layer alone is resistant to reduction by the atomic hydrogen generated in the plasma during the deposition. However, the absorption in the layer of ZnO:Al increases at high wavelengths with an increasing doping rate, as described by Berginski et al. (SPIE Photonics 2006), so much that the constraints of low absorption and low resistivity are opposite to each other, at the level of the material properties themselves. This constraint is added to the evident constraint linked to the fact that a thicker layer has a higher lateral conduction but also a higher absorption. A compromise has thus to be found between these two properties in the structure of a cell or a photovoltaic module.

Particular structures have been developed to try to avoid these drawbacks. The U.S. Pat. No. 4,647,711 describes the inclusion of a current-collector metal grid in the TCO layer. The document WO 2008/005027 describes a photovoltaic cell comprising a conductive layer electrically connected to an electrode grid using trapezoid contact areas.

More particularly, for cells based on crystalline silicon wafers, the document JP2004214442 describes a photovoltaic cell comprising a collector metal grid deposited onto an ITO layer with a regular thickness but with an oxygen concentration rate varying between two values, according to whether the area of the ITO is located below the metal grid or not, in such a manner that the areas that are not below the grid have a lower light absorption coefficient than the areas located below the grid. In this case, the emitter is made of bulk and crystalline materials, and thus is conductive enough to contribute to the lateral conduction.

Another critical element in the manufacturing of photovoltaic modules is the interconnection between the cells. A single one cell provides, through its electrodes, a voltage close to the separation between the Fermi levels of the two doped materials in the cell (~1 V or less), with a current that is proportional to its surface area (10-30 mA/cm$^2$) and thus relatively high (e.g. 10 A for a cell of 20 cm in diameter). The electric power in such an embodiment is not sufficient in a practical point of view, and accordingly, in order to obtain a higher voltage, the cells are interconnected in series to produce a module. For monolithic cells based on crystalline silicon wafers, each cell comprises a complete wafer. The connections in series to form a photovoltaic module are then made by connecting together the conductors coming from each individual cell. For thin-layer photovoltaic modules—as those that use a layer of absorbent material made of amorphous silicon, microcrystalline silicon, either amorphous or microcrystalline silicon and germanium alloy, cadmium-based alloy, or copper, indium, gallium and sulphur alloy—the interconnections between cells are made through masking, deposition and/or etching steps.

Many publications describe optimized implementation methods using techniques such as lift-off, exposure or filling with different materials (WO2008074879, WO2008038553, WO2008016042, US2001037823), as well as laser etching steps (JP2002280580, U.S. Pat. No. 5,981,864, EP0422511). Other documents describe modules in which the cells are connected in parallel (U.S. Pat. No. 6,011,215, CA1227861, U.S. Pat. No. 4,652,693, U.S. Pat. No. 4,745,078).

The thin-layer photovoltaic cells and modules available on the market generally use a layer of high-quality Transparent Conductive Oxide, the thickness, transparency and electric conductivity of which are uniform over the surface area of a cell. However, the photovoltaic efficiency of these cells is not optimum. The interconnections and the distances between theses interconnections are optimized to take into account the fact that no current is generated within an interconnection. From this point of view, the distance between interconnections must be maximized. On the other hand, a great distance between interconnections causes a greater series resistance due to the layer of TCO. The use of a uniform layer of TCO thus leads to a single solution for the optimum distance between interconnections.

SUMMARY OF THE INVENTION

The present invention is outside the framework of the hypothesis of a homogeneous TCO layer. On the contrary, according to the invention, the optimum characteristics of a TCO are used, which vary as a function of the position in this TCO layer. More particularly, the invention relates to a photovoltaic module comprising at least two photovoltaic cells in series, each cell being rectangular in shape and comprising respectively a thin-layer back electrode, a stack of at least two photovoltaic active materials comprised between the back electrode and a second thin-layer transparent conductive (TC) electrode, said TC electrode being capable of collecting and transmitting an electric current generated by the photovoltaic stack, and the two photovoltaic cells being electrically connected in series by an electric contact strip running along a side adjacent to the two cells and comprised between the TC electrode of the first cell and the back electrode of the second cell. According to the invention, the local thickness of the thin-layer transparent electrode of the cell varies as a function of the distance to the electric contact strip.

Advantageously, the optoelectronic properties of the thin-layer transparent electrode vary as a function of the distance to said electric contact strip.

According to a first embodiment, the local thickness and/or the optoelectronic properties of the thin-layer transparent electrode of a cell decrease linearly from the contact strip, according to one direction in the plane of said thin-layer transparent electrode.

According to a second embodiment, the local thickness (e) and/or the optoelectronic properties of the thin-layer transparent electrode of a cell decrease non-linearly from the contact strip, according to one direction in the plane of said thin-layer transparent electrode.

Advantageously, the first electrode is a metal one. Advantageously, the material of TC electrode is a transparent conductive oxide selected among the fluorine-doped tin oxide ($SnO_2$:F), the aluminium-doped zinc oxide (ZnO:Al) or a metal oxide alloy, for example the indium tin oxide (ITO).

According to an embodiment, the photovoltaic module of the invention comprises a series of identical photovoltaic cells deposited onto a same substrate, the photovoltaic stack of active materials comprising amorphous silicon (a-Si:H) (doped or intrinsic).

The invention also relates to various methods for manufacturing a photovoltaic module comprising a series of N rectangular photovoltaic cells of width L.

According to a first deposition method, the thin transparent conductive layer of variable thickness of a series of N cells of a photovoltaic module is deposited onto a substrate by cathode sputtering of a TC material through a semi-transparent mask comprising N saw-teeth of width L, while applying, during the sputtering, a relative translation between the mask and the substrate in the direction of the saw-teeth.

According to a second deposition method, the thin transparent conductive layer of variable thickness is deposited by cathode sputtering of a TC material through two masks comprising a series of N slots of width L and N shield areas of width L, said masks being sequentially movable in translation in two opposite directions.

According to another manufacturing method, the thin transparent conductive layer of variable thickness is deposited onto a substrate by thermal decomposition of a gas precursor (or chemical vapour deposition) through a mask comprising N saw-teeth of width L, while applying, during the thermal decomposition, a relative translation between said mask and said substrate in the direction of the saw teeth.

According to another manufacturing method, the method comprises a step of uniformly depositing a thin transparent conductive layer and a step of liquid chemical etching said TC thin layer by applying said uniform layer to the upper edge of a vessel comprising N etching tanks and, for each tank, means for the filling and the draining of a liquid capable of etching the transparent conductive material and sealing means between each tank. According to this method, the upper edge of the tanks forms a plane inclined with respect to the horizontal level of the liquid in said tanks, so that the filling and the progressive draining of the tanks are capable of non-uniformly etching the transparent conductive layer.

According to still another manufacturing method, the method comprises a step of uniformly depositing a thin transparent conductive layer and a step of liquid chemical etching said thin layer by applying said uniform layer to the upper edge of a vessel comprising N etching tanks comprising common means for the filling and the draining of a liquid capable of etching the transparent conductive material and means for venting the air from each tank. According to this method, the upper edge of the tanks forms a plane inclined with respect to the horizontal level of the liquid in said tanks, so that the progressive venting of the air from said tanks is capable of non-uniformly etching the transparent conductive layer.

According to still another manufacturing method, the method comprises a step of depositing a thin transparent conductive layer and a step of exposing said thin transparent conductive layer to an intense light beam, such as a laser beam, comprising at least one wavelength absorbed by said thin transparent conductive layer.

According to still another manufacturing method, the method comprises a step of depositing an additional layer adjacent to the thin transparent conductive layer and a step of exposing said adjacent layer to an intense light beam, such as a laser beam, comprising at least one wavelength absorbed by said adjacent layer, so as to transfer the energy absorbed by the adjacent layer to said thin transparent conductive layer.

BRIEF DESCRIPTION OF THE DRAWINGS

This description is given by way of non-limitative example and will make it possible to better understand how the invention can be implemented with reference to the appended drawings, in which.

DETAILED DESCRIPTION OF THE PREFERRED EMBODIMENTS

The invention relates to a photovoltaic module comprising PV cells in series, each cell comprising a thin-layer transparent conductive (TC) electrode. The invention also relates to various methods for manufacturing such a photovoltaic-module TC layer.

The invention first relates to a transparent and conductive (TC) layer for a photovoltaic module.

In a module comprising a single cell, the conductive TC layer serves both as a window and as an electrode. In a photovoltaic module comprising several cells connected in series, the TC layer is electrically connected to a contact on the back electrode of the next cell.

The front contact material is preferably indicated as being a transparent conductive (TC) material rather than a transparent conductive oxide (TCO), because it is not essential for the invention that it is an oxide. A TC layer that would not be an oxide—for example a very thin metal layer—would also take advantage from the features of the invention.

Figure 1A:
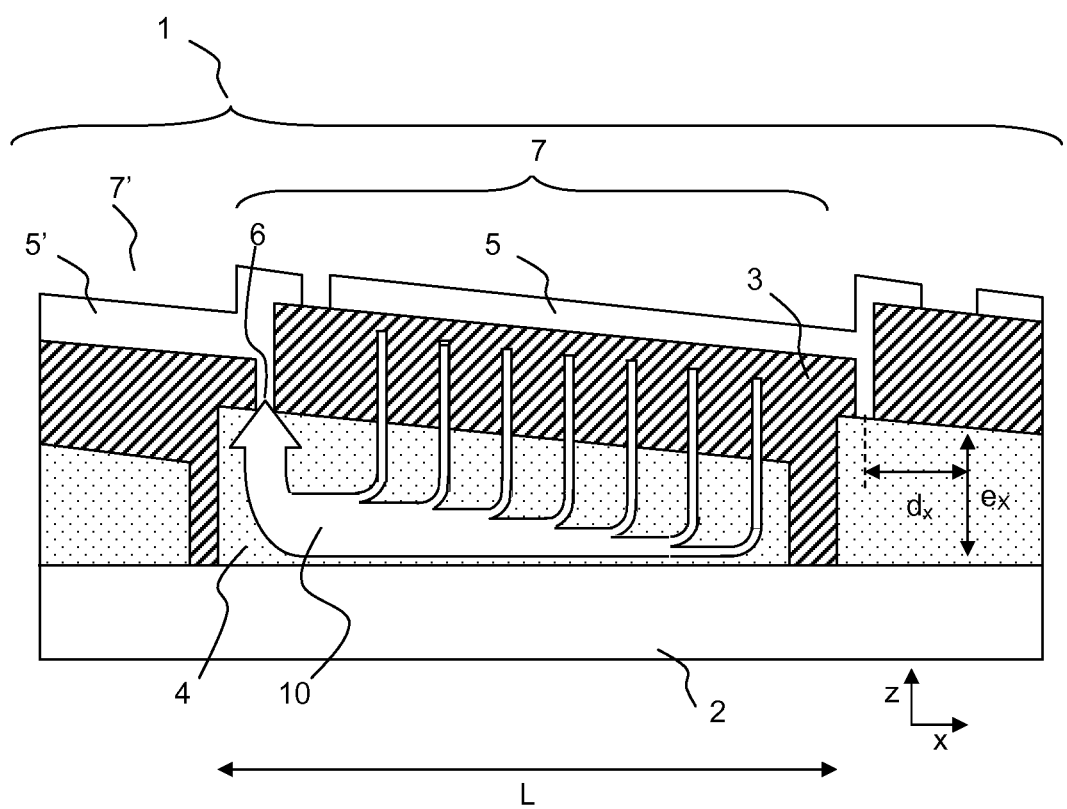
FIG. 1 schematically shows a photovoltaic module according to the invention, in sectional view (FIG. 1A) and in top view (FIG. 1B)
Figure 1B:
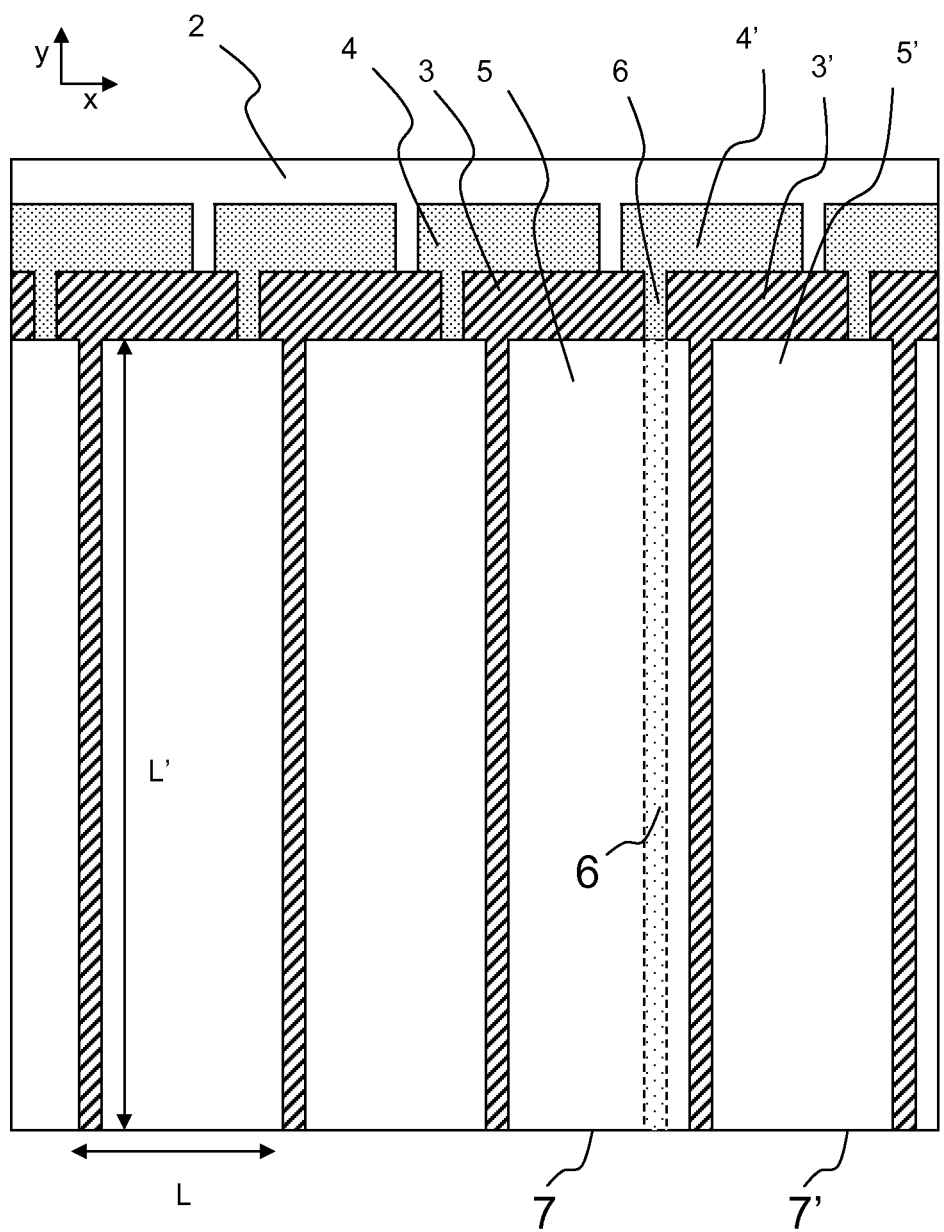

FIG. 1A shows a sectional diagram of a photovoltaic module 1 comprising several photovoltaic cells 7, 7' . . . according to the invention, while FIG. 1B schematically shows this module 1 in top view. The photovoltaic cells 7 and 7' are, in the example, shown as being deposited onto a same substrate 2 and electrically connected in series to each other. A photovoltaic cell 7 comprises a layer 4 of a TC material deposited onto the substrate 2, a stack 3 of photovoltaic materials deposited onto the TC layer 4, and a metal electrode 5. The cells are connected to each other by interconnections formed by an electric contact strip 6 between the TC electrode 4 of a cell 7 and the metal back electrode 5' of the next cell 7'. The substrate 2 is a flat substrate located in a XY plane of a XYZ coordinate system. FIG. 1B shows the contact strip 6 in transparency, such strip 6 running over the whole length L' of a cell 7.

The TC layer 4 of the photovoltaic cell of FIG. 1A has a non-uniform thickness over its surface area. More precisely, the thickness e of the TC layer is at a maximum at the interconnection 6 and decreases as a function of the distance $d_x$ to this interconnection.

Figure 2:
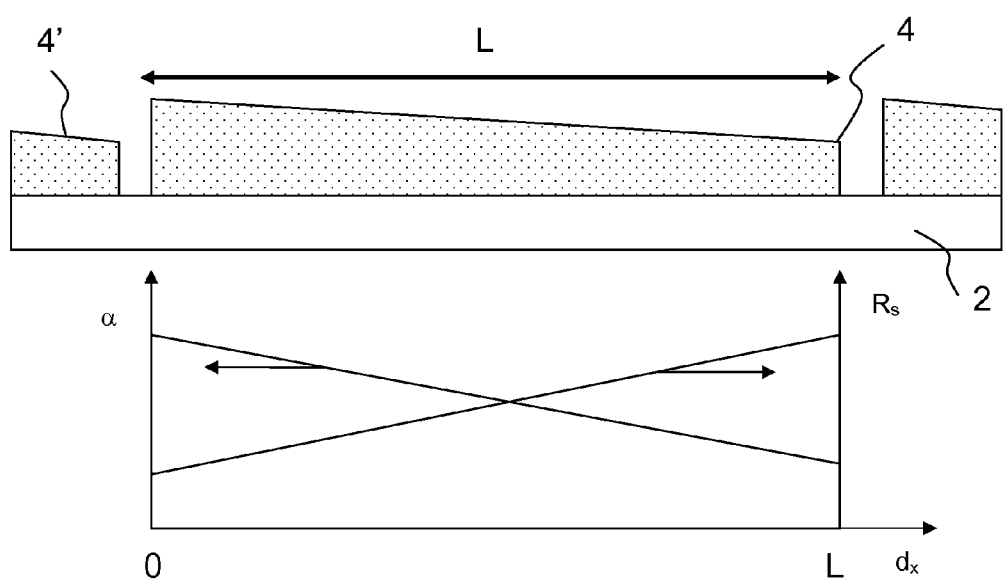
FIG. 2 schematically shows the optical and electrical properties of a photovoltaic cell transparent conductive layer.

This structure of the TC layer 4 makes it possible to obtain a compromise between the optical and electrical properties of the layer 4. Indeed, the properties of the TC layer 4 vary with the position with respect to the interconnection in the module, as schematically indicated in FIG. 1A. Near the interconnection, the electric currents (10) generated by the photovoltaic module and collected by the transparent conductive electrode (shown by arrows) in the cell add to each other, and the relatively higher thickness of the TC layer makes it possible to increase its conductance (or to decrease its layer resistance $R_s$). On the contrary, far from the interconnection, less current flows due to the fact that the thickness of the layer 4 is smaller, the transparency thereof is improved, which makes it possible to maximize the collection of light. This dual effect is schematically shown in FIG. 2. FIG. 2 shows a sectional diagram of a TC layer, the optical (absorption α) and electrical ($R_s$) properties of which vary over the width L of a photovoltaic cell. In this diagram, the optoelectronic properties of the layer 4 vary with the position. The variations of the local thickness and/or of the optoelectronic properties of the transparent conductive electrode layer 4 make it possible to optimize the compromise between conductivity and transparency.

The invention also relates to various embodiments of photovoltaic-module TC layers, the TC layer of each cell of a module having non-uniform thickness and/or optoelectronic characteristics with respect to an electric contact area of interconnection between cells connected in series.

Figure 3:
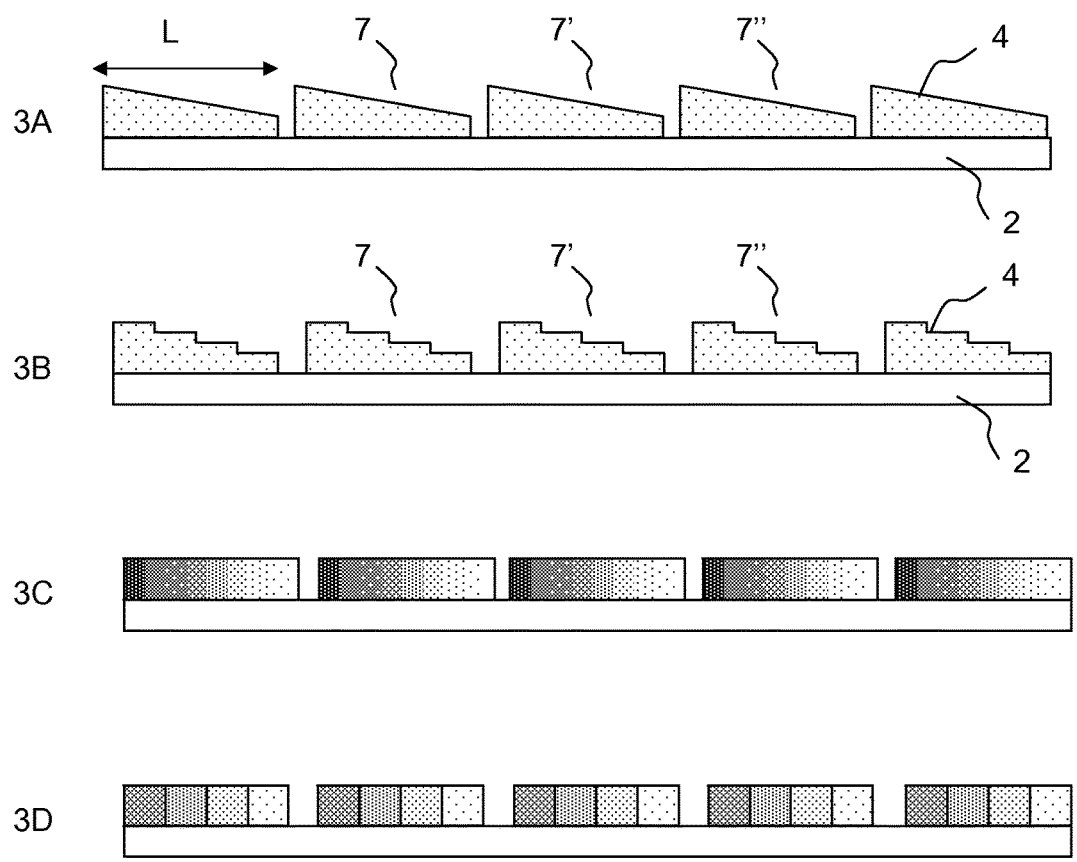
FIG. 3A schematically shows a $1^{st}$ embodiment of a series of photovoltaic cells with a continuous variation of the transparent conductive layer thickness (the other layers of the cells are not shown)
FIG. 3B schematically shows a $2^{nd}$ embodiment of a series of photovoltaic cells with a discontinuous variation of the TC layer thickness.
FIGS. 3C and 3D illustrate the spatial variation of the optoelectronic properties of these $1^{st}$ and $2^{nd}$ embodiments, respectively.

FIGS. 3A and 3B schematically show, in a sectional view, two embodiments of this non-uniformity of thickness of the TC layer 4. According to a first embodiment (FIG. 3A), the thickness variation of the layer 4 is a continuous variation of the layer thickness with respect to the point of interconnection of each cell. In the first embodiment, the thickness variations in the direction perpendicular to the plane of the page do not offer any advantage, but may exist. This first embodiment corresponds to a continuous variation of the TC material properties, as schematically illustrated in FIG. 3C.

According to a second embodiment (FIG. 3B), the thickness variation of the layer 4 is a gradual or discontinuous variation, by steps of constant thickness. In this second embodiment, the thickness variations in the direction perpendicular to the plane of the page do not offer any advantage, but may be present. This second embodiment corresponds to a discontinuous variation of the TC material properties, as schematically illustrated in FIG. 3D.

Other profiles of thickness variation of the TC layer can be advantageously used to optimize the properties of the photovoltaic module.

The invention also relates to various methods for manufacturing photovoltaic-module TC layers of non-uniform thickness. The methods described aim to modify the local thickness of a photovoltaic-cell TC layer rather than its intrinsic physical properties. The techniques described do not exclude the use of an additional step of electrically separating the electrodes, for example, by laser etching.

A first category of method for manufacturing a photovoltaic-module TC layer relates to deposition methods.

A commonly used deposition technique is the sputtering of a target material 11 to a substrate 2. In the case of cells based on crystalline or polycrystalline silicon wafer, this wafer serves as a substrate for the TC electrode deposition. In the case of thin layer cells in a substrate configuration, the TC layer is deposited onto the active layers, the active layers being beforehand deposited onto the substrate.

Various sputtering methods are proposed, which make it possible to obtain directly a TC layer having a desired thickness profile.

Figure 4A:
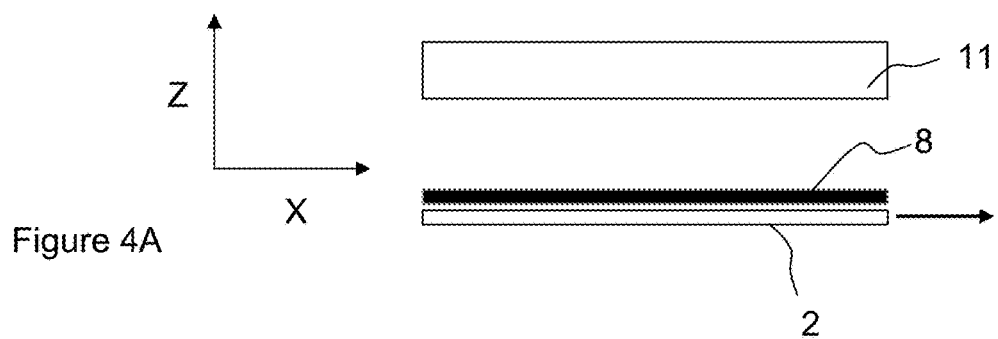
FIGS. 4A-4E schematically show a first sputter deposition method, with a indented mask and/or a mobile substrate at different steps of the deposition method, in side view (FIG. 4A), in top view (4B), in different section planes (4C), in perspective view (4D) and in top view with another mask (4E)
Figure 4B:
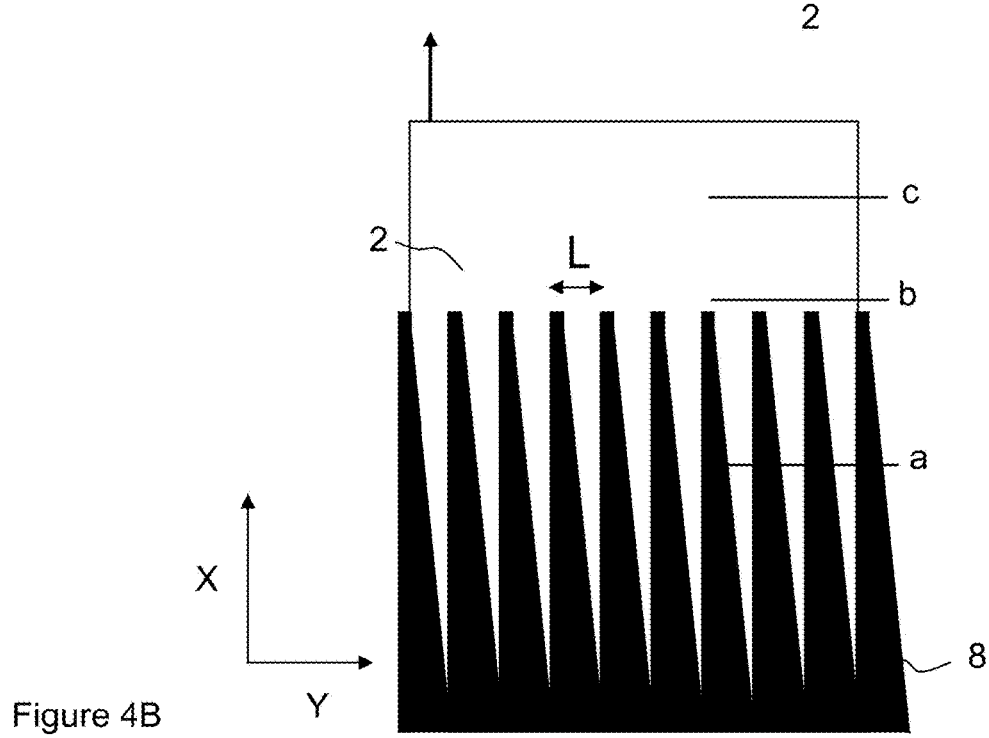
Figure 4C:
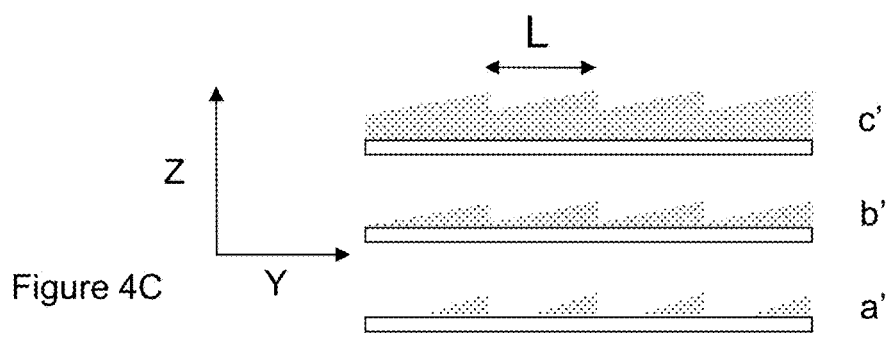
Figure 4D:
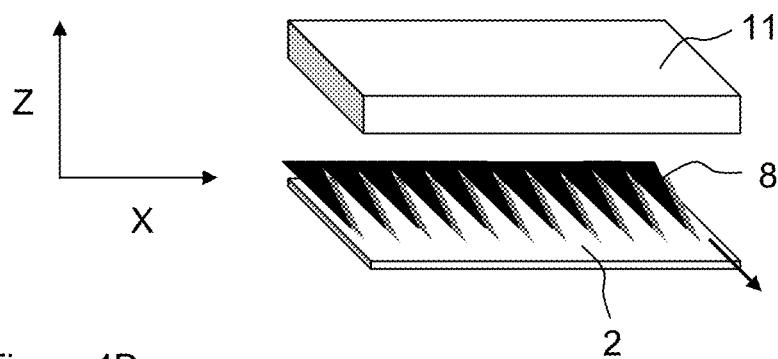
Figure 4E:
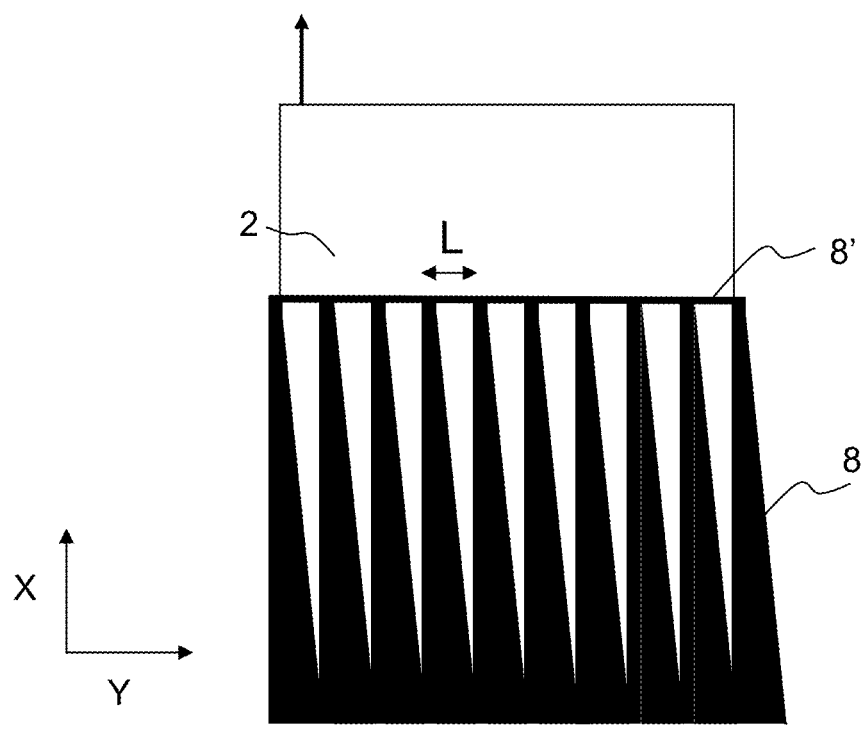

In a $1^{st}$ continuous sputtering method, wherein the substrate 2 is movable during the deposition, a mask 8 is used, a side view of which is shown in FIG. 4A. The mask has a saw-tooth shape, with the spacing between two teeth corresponding to the width L of a photovoltaic cell (FIG. 4B). A side of each tooth is flat so as to well define the separation between two cells. The mask can be made of thin metal, and the ends of the teeth can be self-supported (top view, FIG. 4B) or supported by a side bar 8' (FIG. 4E), which depends on the rigidity and the dimensions of the mask. As the substrate is movable in translation in the direction X during the sputtering, the surface is gradually exposed, the layer 4 is deposited only onto the exposed surface, and a thickness profile varying in one direction is obtained. FIG. 4C shows a sectional view of the profile of the material (a', b' and c') deposited at three locations (a, b and c), i.e. at three instants of time of the process. The relative move of the substrate with respect to the mask 8 is preferentially continuous so that the thickness variations of the TC layer 4 are present only in one direction. With a continuous move, the pattern of the mask is reproduced into the thickness of the layer deposited; a pattern comprising right triangles produces a linear variation in the thickness (FIG. 3A), a pattern comprising curves produces a non-linear variation, and a discontinuous pattern produces a discontinuous thickness profile, as shown for example in FIG. 3B. This method can also be used in an embodiment in which the mask is movable in translation.

Figure 5:
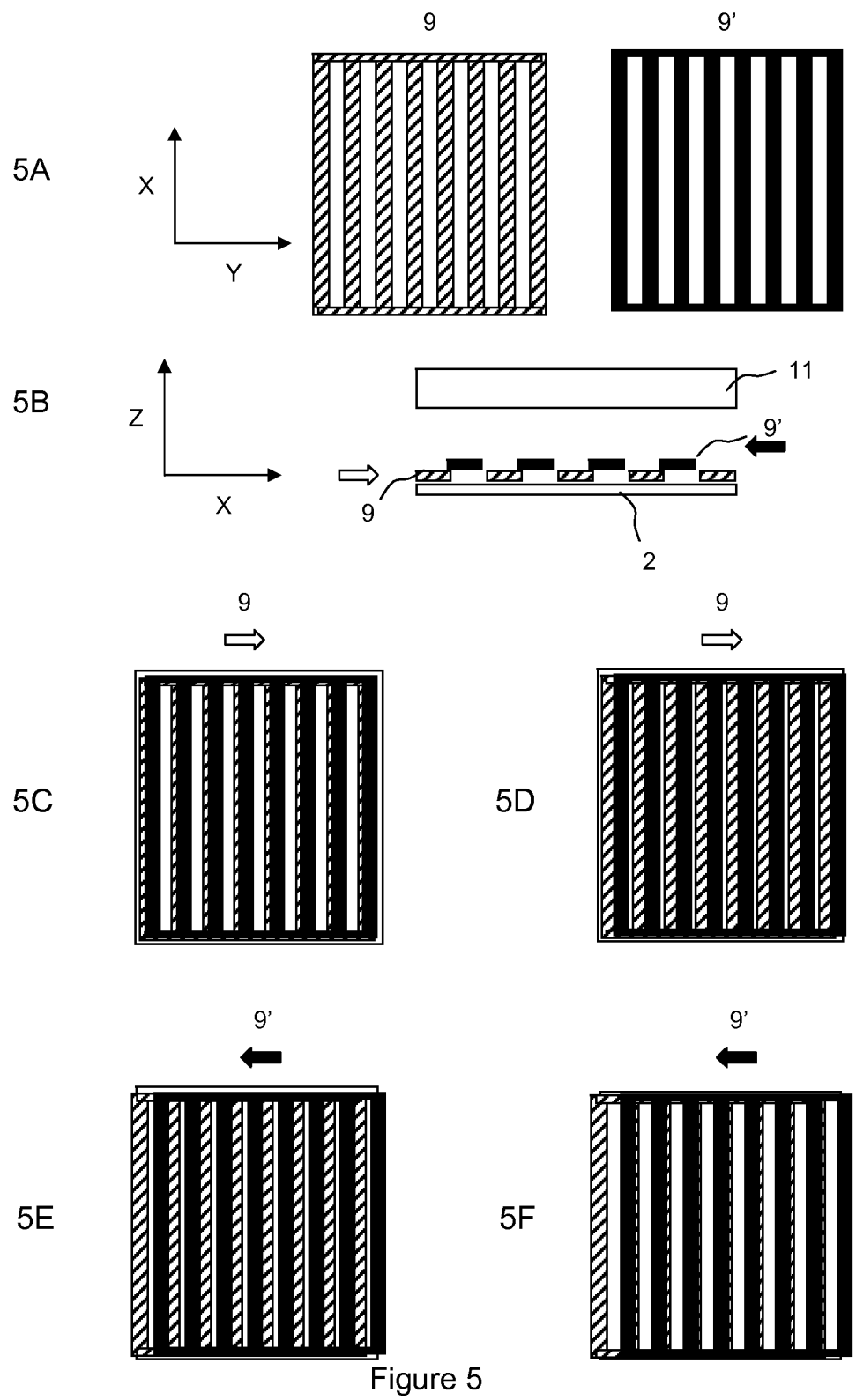
FIGS. 5A-5F schematically show a second sputter deposition method, with two masks moveable according to a sequence illustrated in FIGS. 5C-5D-5E-5F.

In a $2^{nd}$ stationary sputtering method, wherein the substrate is fixed during the deposition, another masking technique is proposed, which uses two complementary masks 9 and 9' as shown in FIG. 5B. Each mask 9, 9' comprises openings, the width of which corresponds to the width L of a photovoltaic cell, and masking areas of identical width L. The surface of the masks 9 and 9' covers the surface of a photovoltaic module. The masks 9 and 9' are initially placed so that the openings of the masks 9 and 9' coincide to each other. During the sputtering of the TCO layer 4, the first mask 9 is moved in one direction until the openings of the masks 9 and 9' are no longer superimposed to each other (sequences 5C-5D). Then, the second mask 9' is moved in the opposite direction, until the openings of the masks 9 and 9' coincide again to each other (sequence 5E-5F). This method makes it possible to produce TC layers 4 of variable thickness according to the moving direction of the masks 9 and 9'. In this method, the speed of displacement of the masks defines the thickness profile of the resulting layer—a constant speed produces a linear profile, a variable speed produces a non-linear profile, and stops produce a profile with thickness discontinuities.

A second category of manufacturing method relates to methods for etching the TC material after deposition.

A commonly used technique for etching and patterning certain TC layers is an aqueous chemical treatment. For example, the use of a diluted solution of HCl (0.5%) etches the ZnO with an etching speed of about 60 Å/s. The duration of exposure to the aqueous mixture 18 defines the duration of etching. However, the etching is generally uniform over the whole surface exposed to the solution. The invention proposes two liquid etching methods, using different etching vessels, for manufacturing simultaneously several photovoltaic cells 7, wherein the TC layers 4 have a variable thickness profile with respect to an electric contact area or strip 6, as described above.

Figure 6:
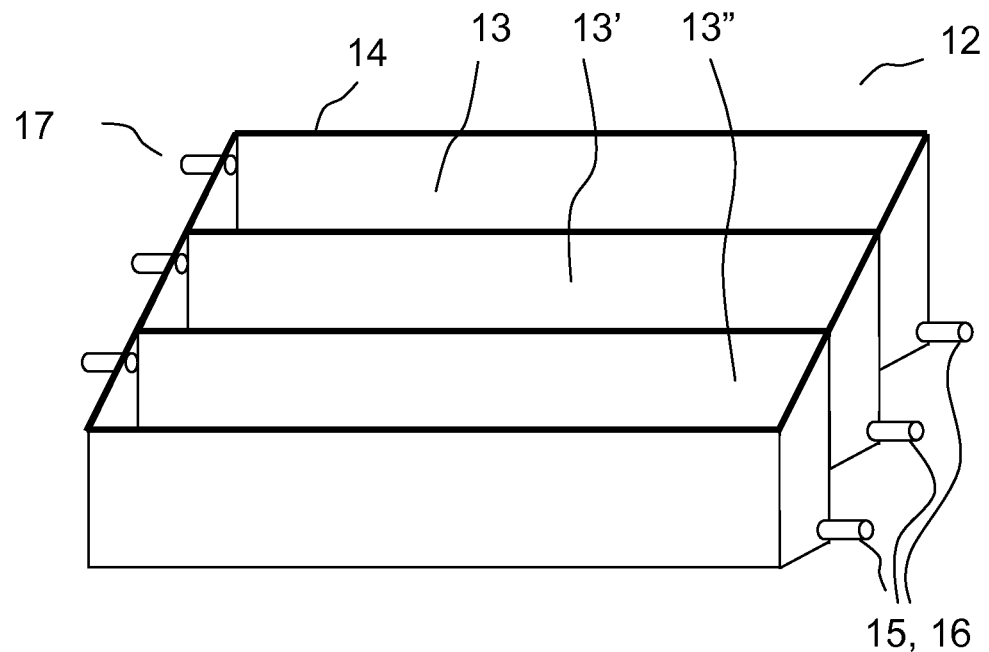
FIG. 6 shows a three-quarter view of a vessel for a first method of liquid chemical etching a photovoltaic module.
Figure 7:
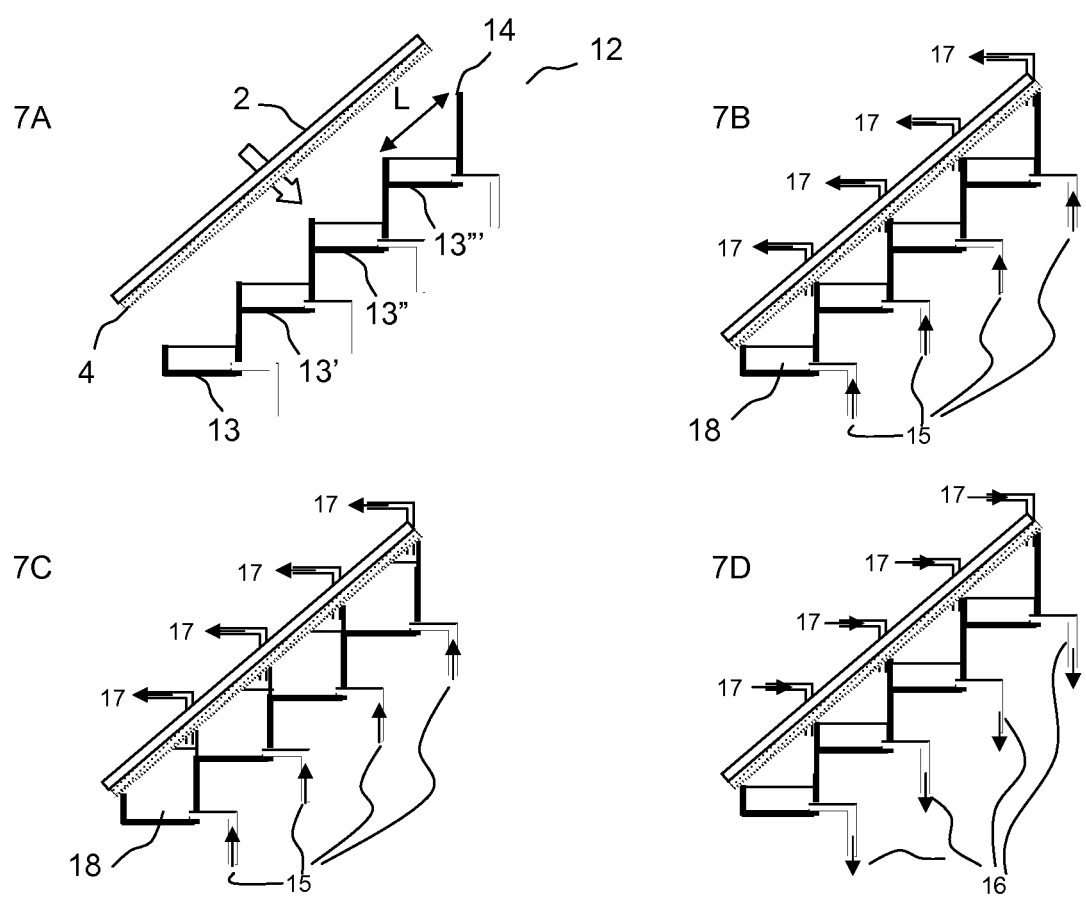
FIGS. 7A-7D schematically show the steps of a first method of liquid chemical etching a photovoltaic module according to the invention.

A first etching vessel structure 12 is schematically shown in FIG. 6. The vessel 12 comprises a series of tanks 13, 13', 13", whose number corresponds to the number of cells of a photovoltaic module. The upper edge 14 of each tank 13, 13', 13" forms a rectangle inclined with respect to the horizontal bottom of the tank. The rectangular opening of a tank corresponds to the surface of a cell and is sealed. The tanks 13, 13', 13" are connected to each other in such a manner that the upper edge of a tank corresponds to the lower edge of the next tank (FIG. 7A). The bottoms of the tanks are shifted with respect to each other (FIG. 7A). Each tank has at least two fluid connections: a filling connection 15 and a draining connection 16 at the bottom of the tank and an air venting connection 17 as close as possible to the top of the tank.

A $1^{st}$ aqueous etching method using the vessel 12 of FIG. 6 is illustrated in FIGS. 7A-7D. The substrate 2 onto which is deposited a TC layer 4 of uniform thickness is placed on the vessel 12 so as to have a sealed contact all around the substrate and between each tank (FIGS. 7A-7B). The tanks 13, 13', 13" are then simultaneously and progressively filled with the aqueous solution 18 (FIG. 7C). The solution 18 being in contact over a longer time in the lower part of each tank, the etching of the layer 4 is more important at this level than opposite the upper part of each tank. This may be obtained by withdrawing a fixed volume of air from each tank through the air venting outlet 17. The speed at which the tanks are filled defines the relative etching at the different points of the surface exposed to the aqueous solution (FIG. 7C), and can be used to control the profile of the TC. The tanks are then drained simultaneously to each other (FIG. 7D), to permit the removal of the patterned and etched substrate thus made. The filling and draining of the tanks 13, 13', 13" simultaneously to each other make it possible to obtain an identical etching profile for each cell of the module on a same substrate 2.

Figure 8:
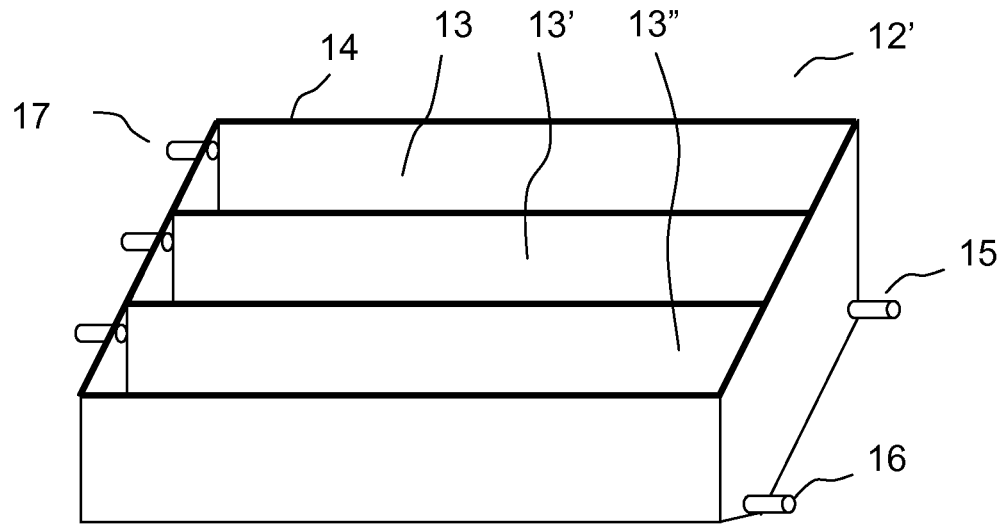
FIG. 8 shows a three-quarter view of a vessel for a second method of liquid chemical etching a photovoltaic module.

A second structure of etching vessel 12' is shown in FIG. 8 and also comprises a series of tanks 13, 13', 13" connected to each other. The rectangular perimeter that defines the edge 14 of a tank is inclined too with respect to the bottom of the tank. The vessel 12' has only one filling fluid connection 15 and only one draining connection 16, and each tank 13, 13', 13" has an air venting input-output connection 17 as close as possible to the top of each tank.

Figure 9:
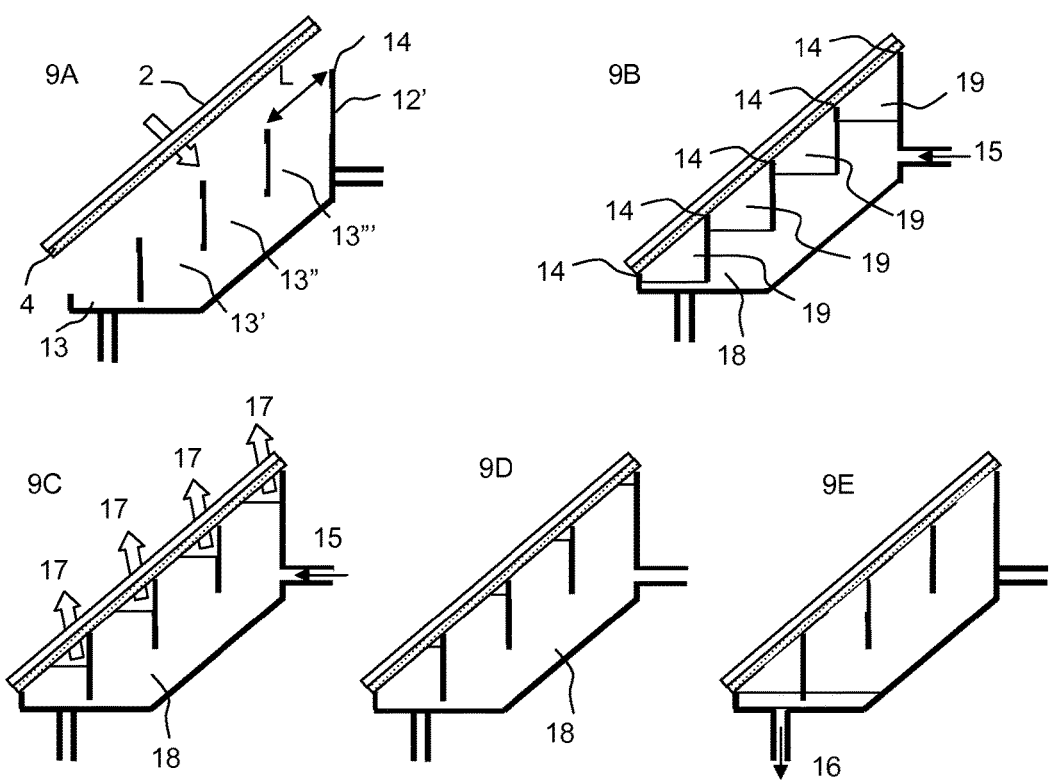
FIGS. 9A-9E schematically show the steps of a second method of liquid chemical etching a photovoltaic module according to the invention.

A $2^{nd}$ aqueous etching method using the vessel 12' of FIG. 8 is illustrated in FIGS. 9A-9E so as to obtain a profile as described in $1^{st}$ part. A photovoltaic module 1 comprising a substrate 2 and a TC layer 4 of initially uniform thickness is placed on the edge 14 of the vessel 12', in a jointed and sealed manner around the substrate and between each tank. The interconnected tanks 13, 13', 13" are filled simultaneously to each other with the aqueous solution 18, through the filling connection 15 (FIG. 9B), although a complete filling is prevented by the trapped air 19 in each tank, which prevent any uncontrolled etching of the surface of the layer 4 during this step. The trapped air 19 is withdrawn simultaneously and progressively from all the tanks (FIGS. 9C-9D), which then allows the etching solution 18 to enter into contact with the TC layer and to etch the surface thereof. After the etching, the solution is withdrawn through the "drain" (FIG. 9D). Accordingly, the speed at which the tanks are filled and drained defines the relative quantity of material that is locally etched at the surface of the TC layer of each cell of the photovoltaic module, and can thus be used to control the final profile of the TC. The filling and draining of the tanks simultaneously to each other make it possible to obtain an identical etching profile on all the cells of a same photovoltaic module.

The structure of a photovoltaic-cell transparent conductive electrode according to the invention comprises a TC layer 4 with a thickness and/or optoelectronic properties varying as a function of the distance $d_x$ to an electric contact area or point 6 of this layer 4. This contact area 6 may be a connection between the TCO layer 4 and an external electrode to extract the current from the cell, or an interconnection between the TCO layer of a first cell 7 and a metal electrode of a second cell 7' in series with the first cell 7 in the photovoltaic module 1. The thickness and/or optoelectronic properties variations are chosen so as to improve the optical transparency of the TCO layer where the current density is low, and to improve the conductive properties of the TCO layer where the current density is high, so as to optimize the whole efficiency of a photovoltaic module.

According to another manufacturing process, the thin transparent conductive layer of variable optoelectronic properties can be obtained by a laser annealing process consisting in exposing a thin transparent conductive layer of uniform optoelectronic properties to a laser beam comprising a wavelength liable to be absorbed by the TC material. A selective exposure of certain areas of the TC layer thus makes it possible to obtain a TC layer with varying optoelectronic properties, as a function of the duration of exposure and/or on the local intensity of the laser beam.

According to an alternative embodiment of this manufacturing method, the method comprises a step of depositing an additional layer adjacent to the thin transparent conductive layer. As used herein, an "adjacent layer" is either a layer deposited within the thin transparent conductive layer (in sandwich), or a layer deposited between the thin transparent conductive layer 4 and the substrate 2, or else a layer deposited between the thin transparent conductive layer 4 and the photovoltaic stack of active materials 3. According to this alternative embodiment, the exposure of this adjacent layer to an intense laser beam comprising at least one wavelength absorbed by said adjacent layer makes it possible to transfer the energy absorbed by the adjacent layer to said thin transparent conductive layer, to produce a TC layer with variable optoelectronic properties.

A photovoltaic module according to the invention may be made according to various deposition and/or etching manufacturing methods. In particular, the invention proposes methods of depositing a transparent conductive (TC) layer and methods of etching after the deposition, making it possible to manufacture simultaneously several cells of a same module. The deposition methods comprise a masking step for generating the structure of non-uniform thickness, and suit to all types of TCO. The etching methods comprise a step of chemical etching, and suit particularly to the TCO that also require an etching step to generate a pattern (eg: ZnO:Al by magnetron sputtering) for the photovoltaic applications.

The methods described herein are relatively simple but are not necessarily the only methods that make it possible to manufacture photovoltaic modules according to the invention.

The invention makes it possible to noticeably improve the efficiency of the photovoltaic modules without significantly increasing the complexity of these modules and by applying the simple manufacturing methods.

A cell of a photovoltaic module according to the invention does not use a uniform TCO layer but, on the contrary, uses the optimum characteristics of a TCO layer that vary as a function of the position of the layer and of the distance to the interconnection between cells.

The invention claimed is:
1. A photovoltaic module (1), comprising:
   two photovoltaic cells (7, 7') in series and deposited onto a same substrate (2),
   each of the two photovoltaic cells (7, 7') being rectangular in shape having a width (L) and each comprising:
      a thin-film back electrode (5, 5'),
      a transparent window suitable for light to pass through, said transparent window comprising a thin-film transparent conductive electrode (4, 4') of aluminum-doped zinc oxide (ZnO:Al) deposited by low-pressure chemical vapor deposition (LPCVD), and
      a photovoltaic stack of photovoltaic active materials (3, 3'), comprising doped or intrinsic amorphous silicon (a-Si:H), located between the thin-film back electrode (5, 5') and said thin-film transparent conductive electrode (4, 4'),
      said thin-film transparent conductive electrode (4, 4') being capable of collecting and transmitting an electric current (10, 10') generated by the photovoltaic stack,
   wherein the two photovoltaic cells (7, 7') are electrically connected in series by an electric contact strip (6) running along a side adjacent to the two photovoltaic cells (7, 7'), said contact strip (6) being located between the thin-film transparent conductive electrode (4) of a first of the two photovoltaic cells (7) and the thin-film back electrode (5') of a second of the two photovoltaic cells (7'),
wherein a local thickness (e) of the thin-film transparent conductive electrode (4) of the first of the two photovoltaic cells (7) varies as a function of a distance to said electric contact strip (6),
said local thickness (e) of the thin-film transparent conductive electrode (4) of the first of the two photovoltaic cells (7) decreasing linearly over an entirety of the width (L) of the first of the two photovoltaic cells (7) from the contact strip (6) over the surface area of the thin-film transparent conductive electrode (4) of the first of the two photovoltaic cells (7) according to one direction (X) transverse to said contact strip (6) in a plane of the thin-film transparent conductive electrode (4) of the first of the two photovoltaic cells (7), and
said local thickness (e) decreasing such that the thin-film transparent conductive electrode (4) of the first of the two photovoltaic cells (7) has a higher thickness and a higher conductance near an interconnection formed by said contact strip (6), and such that the thin-film transparent conductive electrode (4) of the first of the two photovoltaic cells (7) has a lower thickness and a lower optical absorption at an edge of the first of the two photovoltaic cells (7) separated by said entirety of the width from the interconnection formed by said contact strip (6).

2. The photovoltaic module (1) according to claim 1, wherein optoelectronic properties of the thin-film transparent conductive electrode (4) of the first of the two photovoltaic cells (7) vary as a function of the distance to said electric contact strip (6).

3. The photovoltaic module (1) according to claim 1, wherein optoelectronic properties of the thin-film transparent conductive electrode (4) of the first of the two photovoltaic cells (7) decrease linearly from the contact strip (6), according to one direction (X) in the plane of said thin-film transparent conductive electrode (4) of the first of the two photovoltaic cells (7).

4. The photovoltaic module (1) according to claim 1, wherein optoelectronic properties of the thin-film transparent conductive electrode (4) of the first of the two photovoltaic cells (7) decrease non-linearly from the contact strip (6), according to one direction (X) in the plane of said thin-film transparent conductive electrode (4) of the first of the two photovoltaic cells (7).

5. The photovoltaic module (1) according to claim 1, wherein the two photovoltaic cells are provided, in series, with one or more additional photovoltaic cells (7" . . . ), all deposited onto the same substrate (2),
wherein a photovoltaic stack (3" . . . ) of each of the additional photovoltaic cells comprises doped or intrinsic amorphous silicon (a-Si:H).

6. A method for manufacturing the photovoltaic module (1) according to claim 1, comprising:
depositing a series of N rectangular photovoltaic cells (7, 7', 7" . . . ) of width L onto the same substrate (2) by cathode sputtering of a transparent conductive material through a mask (8) comprising N saw-teeth of width L, while applying, during the cathode sputtering, a relative translation between said mask and said substrate in the direction (X) of the saw-teeth.

7. A method for manufacturing the photovoltaic module (1) according to claim 1, comprising:
providing the two photovoltaic cells in series as a series of N photovoltaic cells (7, 7', 7" . . . ) of width L, wherein the thin-film transparent conductive layer (4, 4', 4" . . . ) of the first of the two photovoltaic cells is deposited by cathode sputtering of a transparent conductive material through two masks (9, 9') comprising a series of N slots of width L and N shield areas of width L, said masks (9, 9') being sequentially movable in translation in two opposite directions.

8. A method for manufacturing the photovoltaic module (1) according to claim 1, comprising:
providing the two photovoltaic cells in series as a series of N rectangular photovoltaic cells (7, 7', 7" . . . ) of width L, wherein the thin-film transparent conductive layer of the first of the two photovoltaic cells is deposited onto the substrate (2) by thermal decomposition of a gas precursor through a mask (8) comprising N saw-teeth of width L, while applying, during the thermal decomposition, a relative translation between said mask and said substrate in the direction (X) of the saw teeth.

9. A method for manufacturing the photovoltaic module (1) according to claim 1, comprising:
depositing, on a substrate, a thin transparent conductive (TC) layer with a uniform thickness; and
liquid chemical etching said thin TC layer by applying said thin TC layer to an upper edge (14) of a vessel (12) comprising N etching tanks (13, 13', 13", 13'") and, for each tank, applying an etching liquid (18) that etches transparent conductive material of the thin TC layer,
said upper edge (14) forming a plane inclined with respect to the horizontal level of the etching liquid applied to said N etching tanks (13, 13', 13", 13'"), so that the applying of the etching liquid by filling and draining the etching liquid from the N etching tanks non-uniformly etches the thin TC layer.

10. A method for manufacturing the photovoltaic module (1) according to claim 1, comprising:
depositing, on a substrate, a thin transparent conductive (TC) layer with a uniform thickness; and
liquid chemical etching said thin TC layer by applying said thin TC layer to an upper edge (14) of a vessel (12') comprising N etching tanks (13, 13', 13", 13'"), and applying an etching liquid (18) that etches the transparent conductive material of the thin TC layer, said applying including filling the N etching tanks with the etching liquid, draining the N etching tanks of the etching liquid, and venting air from each of the N etching tanks,
said upper edge (14) forming a plane inclined with respect to a horizontal level of the etching liquid (18) applied to said N etching tanks (13, 13', 13", 13'"), so that the venting (17) of the air from said N etching tanks non-uniformly etches the thin TC layer.

11. A method for manufacturing the photovoltaic module (1) according to claim 1, comprising:
depositing a thin transparent conductive layer; and
exposing said thin transparent conductive layer to an intense light beam that includes at least one wavelength absorbed by said thin transparent conductive layer.

12. The method according to claim 11, further comprising:
depositing an additional layer adjacent to the thin transparent conductive layer, and a step of exposing said additional layer to an intense light beam that includes at least one wavelength absorbed by said additional layer, so as to transfer the energy absorbed by the additional layer to said thin-film transparent conductive layer (4) of the first of the two photovoltaic cells (7).

13. The photovoltaic module (1) according to claim 2, wherein optoelectronic properties of the thin-film transparent conductive electrode (4) of the first of said two photovoltaic cells (7) decrease linearly from the contact strip (6), according to one direction (X) in the plane of said thin-film transparent conductive electrode (4) of the first of the two photovoltaic cells (7).

14. The photovoltaic module (1) according to claim 2, wherein optoelectronic properties of the thin-film transparent conductive electrode (4) of the first of said two photovoltaic cells decrease non-linearly from the contact strip (6), according to one direction (X) in the plane of said thin-film transparent conductive electrode (4) of the first of the two photovoltaic cells (7).

15. The photovoltaic module (1) according to claim 2, wherein the two photovoltaic cells are provided, in series, with one or more additional photovoltaic cells, (7" . . . ), all deposited onto the same substrate (2),
    wherein the photovoltaic stack (3" . . . ) of each of the additional photovoltaic cells comprises doped or intrinsic amorphous silicon (a-Si:H).

16. The photovoltaic module (1) according to claim 3, wherein the two photovoltaic cells are provided, in series, with one or more additional photovoltaic cells (7" . . . ), all deposited onto the same substrate (2),
    wherein the photovoltaic stack (3" . . . ) of each of the additional photovoltaic cells comprises doped or intrinsic amorphous silicon (a-Si:H).

* * * * *